(12) United States Patent
Efimov et al.

(10) Patent No.: US 7,836,383 B2
(45) Date of Patent: Nov. 16, 2010

(54) LOW DENSITY PARITY CHECK (LDPC) CODE DECODER

(75) Inventors: Andrey Efimov, Saint Petersburg (RU); Andrey Belogolovy, Saint Petersburg (RU); Aliaksei Chapyzhenka, Saint Petersburg (RU)

(73) Assignee: Intel Corporation, Santa Clara, CA (US)

( * ) Notice: Subject to any disclaimer, the term of this patent is extended or adjusted under 35 U.S.C. 154(b) by 1116 days.

(21) Appl. No.: 10/590,613

(22) PCT Filed: Apr. 28, 2006

(86) PCT No.: PCT/RU2006/000219

§ 371 (c)(1), (2), (4) Date: Aug. 24, 2006

(87) PCT Pub. No.: WO2007/126328

PCT Pub. Date: Nov. 8, 2007

(65) Prior Publication Data

US 2008/0292025 A1    Nov. 27, 2008

(51) Int. Cl.
H03M 13/03    (2006.01)
(52) U.S. Cl. .................................................. 714/780
(58) Field of Classification Search ............... 714/780
See application file for complete search history.

(56) References Cited

U.S. PATENT DOCUMENTS

| | | | |
|---|---|---|---|
| 6,421,804 B1 * | 7/2002 | Lee | 714/755 |
| 6,691,263 B2 * | 2/2004 | Vasic et al. | 714/709 |
| 7,139,959 B2 * | 11/2006 | Hocevar | 714/752 |
| 2003/0104788 A1 | 6/2003 | Kim | |
| 2004/0153959 A1 | 8/2004 | Kim et al. | |
| 2005/0210366 A1 | 9/2005 | Maehata | |
| 2006/0195765 A1 * | 8/2006 | Coffey | 714/760 |

FOREIGN PATENT DOCUMENTS

| | | |
|---|---|---|
| EP | 1 643 653 A | 4/2006 |
| WO | WO 2005/096509 A | 10/2005 |

OTHER PUBLICATIONS

PCT/RU2006/000219—International Search Report, Jun. 18, 2007, Intel Corporation.
PCT/RU2006/000219—Written Opinion of the International Searching Authority, Jun. 18, 2007, Intel Corporation.

(Continued)

Primary Examiner—Scott T Baderman
Assistant Examiner—Enam Ahmed
(74) Attorney, Agent, or Firm—Blakely, Sokoloff, Taylor & Zafman LLP

(57) ABSTRACT

An embodiment of a decoder comprises processing elements operating on associative processing. The processing elements may comprise a logic and memory element. Each row of the decoder comprises one or more associative processing elements controlled by a row control element to determine the two minimum values. Each column comprises one or more associative processing elements, an input processing element, and a column control element to determine hard decision bits. The usage of processing elements to construct a decoder may reduce the gate count and decrease the interconnects used to couple the elements.

26 Claims, 8 Drawing Sheets

OTHER PUBLICATIONS

Parhami, B. "Extreme value search and general selection algorithms for fully parallel associative memories." Computer Journal, Oxford University Press, Surrey GB, vol. 39, No. 3, 1996.

Hanlon, A.G. "Content-addressable and associative memory systems, a survey." IEEE Transactions on Electronic Computers USA, vol. EC-15, No. 4, Aug. 1966.

IEEE Standard 802.3an, approved on Jun. 8, 2006, published Sep. 1, 2006, 19 pages.

Tanner, R., "A Recursive Approach to Low Complexity Codes", IEEE Trans. Inform. Theory, 1981, pp. 533-547, vol. IT-42.

Scherson, I. et al., "Bit-Parallel Arithmetic in a Massively-Parallel Associative Processor", IEEE Transactions on Computers, Oct. 1992, pp. 1201-1210, vol. 41, No. 10.

Krikelis, A. et al., "Associative Processing and Processors", IEEE, Nov. 2004, pp. 12-17.

* cited by examiner

US 7,836,383 B2

LOW DENSITY PARITY CHECK (LDPC) CODE DECODER

CROSS-REFERENCE TO RELATED APPLICATION

This application is a National Phase application of, and claims priority to, International Application No. PCT/RU2006/000219, filed Apr. 28, 2006, entitled A LOW DENSITY PARITY CHECK (LDPC) CODE DECODER

BACKGROUND

A communication environment generally refers to a group of interconnected wired and/or wireless devices such as, for example, laptops, mobile phones, servers, fax machines, printers, etc, which may send/receive data. The transmitting devices may often encode the information before transferring the encoded data over a communication medium provisioned between the devices. The receiving devices may perform decoding, error detection and correction and such other operations to extract the information.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

DETAILED DESCRIPTION

The following description describes a low density parity check (LDPC) decoder. In the following description, numerous specific details such as logic implementations, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits, and full software instruction sequences have not been shown in detail in order not to obscure the invention. Those of ordinary skill in the art, with the included descriptions, will be able to implement appropriate functionality without undue experimentation.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Figure 1:
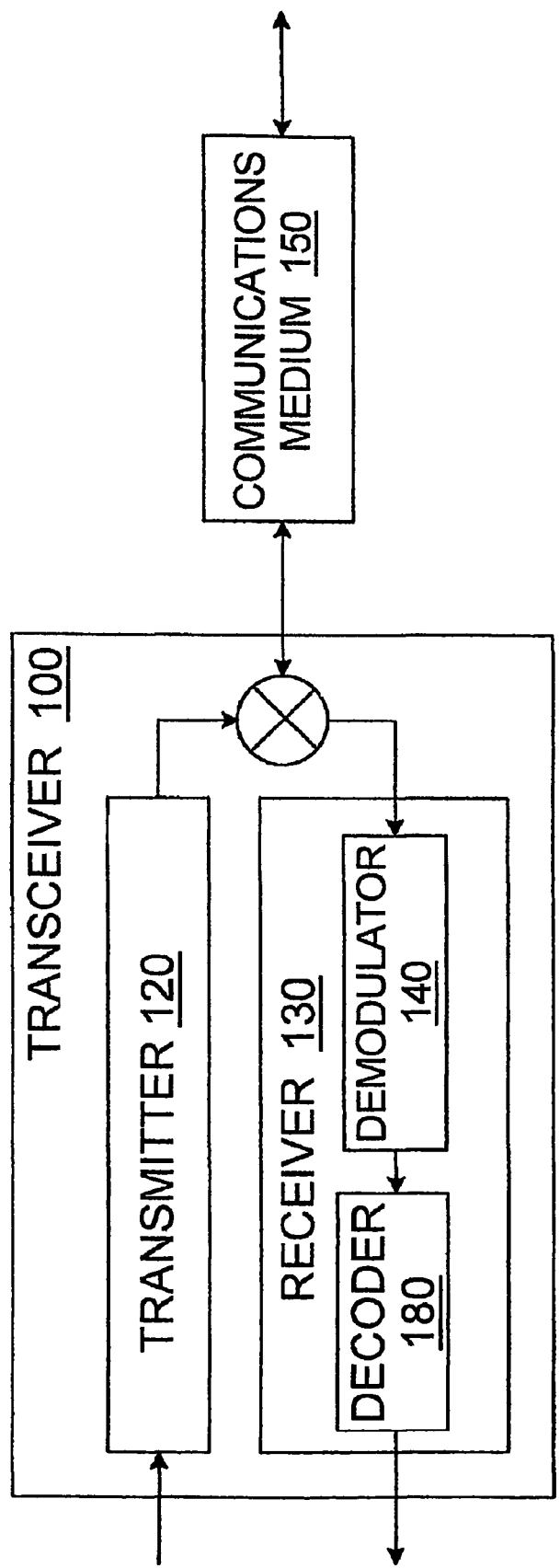
FIG. 1 illustrates an embodiment of a communication system comprising a transceiver 100 and communication channel 150.

An embodiment of a portion of a communication system is illustrated in FIG. 1. The portion of the communication system may comprise a transceiver 100 and a communication medium 150. The transceiver 100 may send and receive signals over the communication medium 150. The communication medium 150 may represent a wired medium such as a co-axial cable, an optical fiber, and a wireless medium. The transceiver 100 may be used, for example, in network interface cards (NIC), physical layer devices (PHYs) and such other devices. In one embodiment, the transceiver 100 may comprise a transmitter 120 and a receiver 130.

The transmitter 120 may receive a data bit stream or information bits, process the data bit stream to generate a signal or a symbol or a codeword, and then transmit the signal on the communication medium 150. In one embodiment, the transmitter 120 may process the data bit stream using techniques such as framing, scrambling, encoding, and mapping. In one embodiment, the transmitter 120 may encode the data bit stream using low density parity check (LDPC) codes. The transmitter 120 may modulate the bit stream using pulse amplitude modulation (PAM), binary phase shift keying (BPSK) and such other modulation techniques.

The receiver 130 may generate data bits from a received signal before sending the data bits for further processing, for example, to a switch, router, or any device configured to receive data bits. In one embodiment, the receiver 130 may process the codewords using techniques such as demodulation and decoding. In one embodiment, the receiver 130 may use LDPC codes and iterative decoding techniques to decode the codewords.

An embodiment of the receiver 130 may comprise a demodulator 140 and a decoder 180. In one embodiment, the demodulator 140 may generate soft decision values based on the received symbols or codewords and provide the soft decision values to the decoder 180. In one embodiment, the soft decisions may represent a likelihood that a bit may represent a one or zero. The soft decision values may be taken into account when determining the value of the bit from the received codeword. In one embodiment, the demodulator 140 may use information relating to the confidence of the received codeword and the properties, such as signal-to-noise ratio (SNR), of the communication medium 150 to generate the soft decision values.

In one embodiment, the decoder 180 may generate data bits by decoding the codewords based on, for example, a multi-threshold decision scheme. The decoder 180 may perform iterative decoding based on the LDPC coding techniques. In one embodiment, the decoder 180 may perform iterative decoding until a desired data stream is generated from the codeword or until a number of iterations equaling log 2 n is complete, where n is a code length of the codeword.

In one embodiment, the decoder 180 may generate initial reliability values and initial hard decision values based on the soft decision values. In one embodiment, the decoder 180 may receive initial threshold values (Ti) as well and the decoder 180 may decode the codewords using a LDPC parity check matrix (H), the initial reliability values (Ri) and the initial hard decision values (Xi). The decoder 180 may iteratively compute parity check values starting from the initial values of Ri, Xi, and Ti and may generate a new hard decision vector. The decoder 180 may terminate the iterations if the new hard decision vector represents the desired data stream or the decoder 180 may perform pre-determined number of iterations before determining to request for a re-transmission.

In one embodiment, the decoder 180 may use one or more processing elements (PE) operating based on associative processing to perform iterative decoding to decode the symbols received from the communication medium 150. In one embodiment, the elements may comprise a processing logic and a memory to perform operations to identify the stored data based on content of a memory location as compared to identifying the data based on a location or an address. For example, the elements may operate as content addressable memory (CAM) rather than as a random access memory (RAM).

In one embodiment, the decoder 180 may use the PEs to implement one or more check node update units (CNU) and variable node update units (VNU) of a decoder implemented based on the LDPC decoding. A CNU may be coupled to one or more VNUs based on the position of 'ones' in a corresponding row and a column of the parity check matrix (H). In one embodiment, the decoder 180 may operate based on an uniformly most powerful (UMP), min-sum, or a posteriori probability (APP) algorithm that may also be implemented using the PEs.

Figure 2:
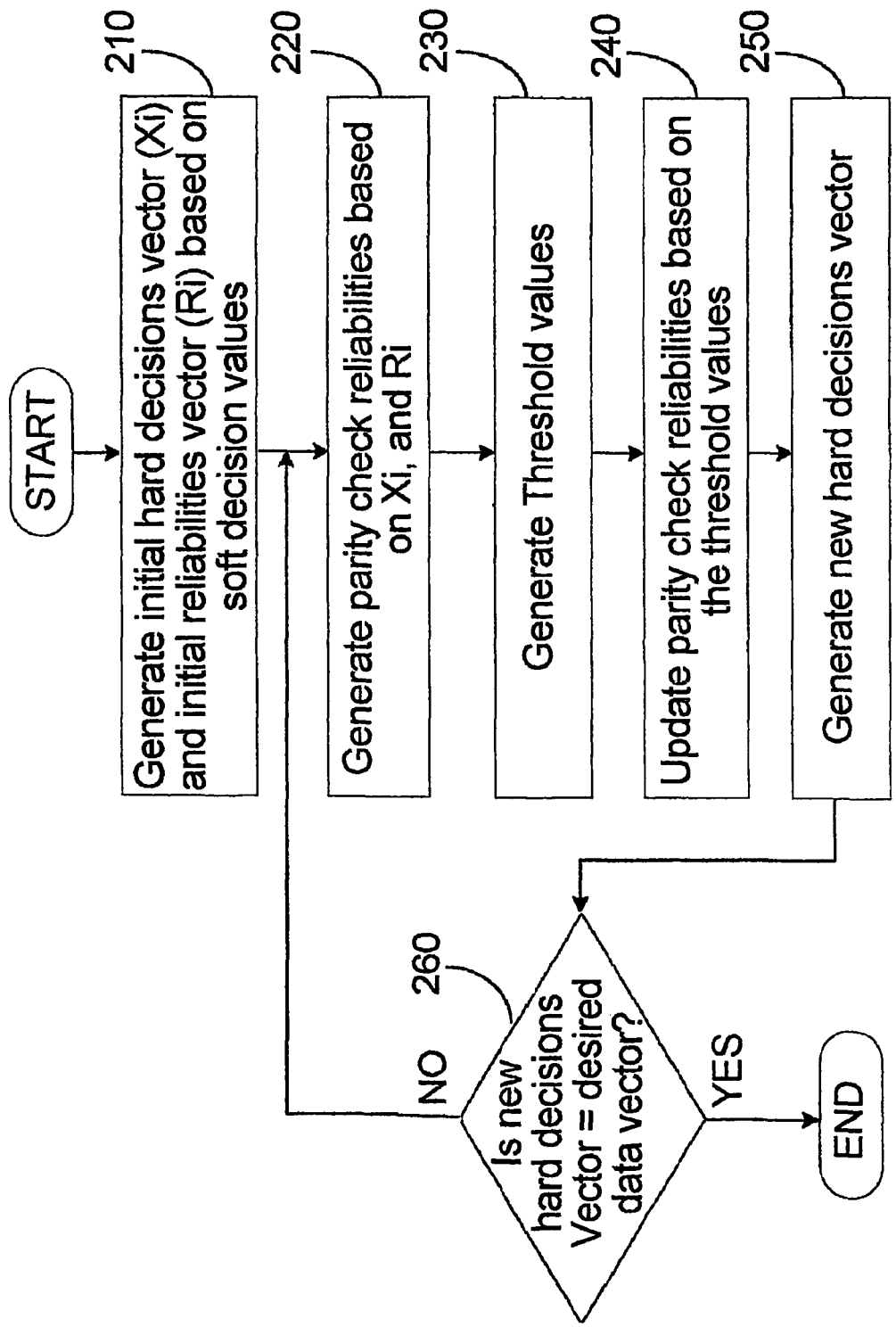
FIG. 2 illustrates an embodiment of an operation of the decoder depicted in FIG. 1.

An embodiment of an operation of the decoder 180 implemented based on a multi-threshold decision scheme is Illustrated in FIG. 2. In block 210, the decoder 180 may generate an initial hard decision vector (Xi) and an initial reliabilities vector (RI) based on the soft decision values. For a received codeword, $Y=(Y1, Y2, \ldots, Yn)$, let N(m) be the set of codeword positions that are used in an $m^{th}$ parity check: $N(m)=\{n: H(m,n)=1\}$, where H is the parity check matrix and H(m,n)=1 indicates that the value of the H matrix at the (m,n) position equals one. Further, M(n) may be the set of parity checks that includes $n^{th}$ codeword position: $M(n)=\{m: H(m,n)=1\}$.

At initialization, for every element, Yi, of the received vector, the decoder 180 may generate the hard decision value Xi and the bit reliability value Ri. In one embodiment, the decoder 180 may set the bit reliability value Ri to the absolute value of Yi and the hard decision value Xi to one if Yi is greater than zero, and to zero otherwise. For example, the decoder 180 may generate a Xi=0 and Yi=2.48, if the value of Yi equals −2.48. For every m belonging to M(n), a parity check bit reliability is defined as Ymn, where initially Ymn=Rn, and an associated hard decision is defined as Xmn, where Initially Xmn=Xn.

In block 220, the decoder 180 starts to perform an Iterative decoding process by generating parity check reliabilities values based on Xi and Ri. In one embodiment, for each n and each m belonging to M(n), the decoder 180 may determine the check sums, Smn. In one embodiment, the decoder 180 may determine the check sum as follows:

$Smn=(Xn)$ XOR (summation of Xmn' MOD 2), where the summation is over n' belonging to N(m)\n and N(m)\n represents a set N(m) with bit 'n' excluded.

In one embodiment, the decoder 180 may Identify a value for the minimum of Ymn as follows:

$Ymn(min)=min$ of $\{Ymn'\}$ for n' belonging to N(m)\n.

In block 230, the decoder 180 may compute a threshold value. In one embodiment, the decoder 180 may set the threshold to the minimum value, over all n, of the set of an updated bit reliabilities defined for each n as follows:

$Zn=Rn+summation\ (-1)^{Smn}Ymn(min)$ for m belonging to M(m).

The updated bit reliability Zn may also act as comparison reliabilities Zmn in the decoding process.

In one embodiment, the decoder 180 may generate the multi-value threshold by, adaptively, computing the threshold value during each iteration of the decoding process. In another embodiment, the decoder 180 may generate the multi-value threshold by computing a value for the threshold during the first iteration using the updated bit reliabilities and may provide a fixed value, such as zero, for the remaining iterations. In another embodiment, the decoder 180 may assign pre-determined values to the multi-value threshold values and the pre-determined values may be based on the characteristics, such as signal-to-noise ratio, of the communication medium 150.

In block 240, the decoder 180 may update the parity check bit reliabilities based on prior parity check reliability values and the multi-value threshold values, respectively, determined in the block 220 and 230. In one embodiment, the decoder 180 may compute comparison reliabilities Zmn based on the initial reliability value (Rn), check sum (Smn) and the minimum of the parity-check reliability value Ymn (min). For each n and each m belonging to M(n), the decoder 180 may determine the comparison reliability value Zmn as follows:

$Zmn=Rn+summation\ of\ (-1)^{Sm'n}Ym'n(min)$ for m' belonging to N(n)\m.

For each n, the decoder 180 may update the parity check bit reliabilities based on the comparison reliabilities, Zmn. Updating a reliability or a hard decision value includes maintaining the value of the reliability or the hard decision, if the comparison indicates that the reliability or the hard decision should remain the same. In one embodiment, the decoder 180 may determine the parity-check reliability Ymn and Xmn as follows:

Ymn=Zmn, (if Zmn>0), or, −Zmn, (if Zmn<threshold), or 0, otherwise.

Xmn=Xmn, (if Zmn>threshold) or (1−Xmn) if Zmn<threshold.

In block 250, the decoder 180 may generate a new hard decision vector, C, based on the comparison reliabilities Zmn. The decoder 180 may determine the elements Ci of the hard decision vector as follows:

Ci=Xi (if Zmn>zero); and (1−Xi) if Zmn<zero.

In one embodiment, the decoder 180 may generate a new hard decision vector by maintaining the value of the bit, if the comparison reliability Zmn indicates that the bit should remain the same and changing the bit otherwise.

In block 260, the decoder 180 may determine if the vector C equals a desired data vector and control passes to block 220 if the condition is false and the decoding process ends otherwise.

Figure 3A:
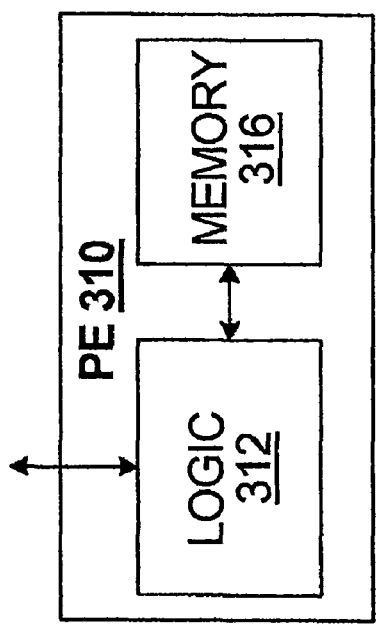
FIG. 3A Illustrates an embodiment of a processing element (PE) operating based on associative processing.

An embodiment of a processing element (PE) 310 is illustrated in FIG. 3A. The PE 310 may comprise logic 312 and a memory 316. In one embodiment, the processing element 310 may accept a comparand and a mask as inputs, search all stored data locations in the memory 316 simultaneously. The processing elements 310 may match the masked-on bits of the comparand and the corresponding bits in the memory 316 and identify the matching data words. In one embodiment, the PE 310 may set a marker or a tag to indicate the presence of a match.

Figure 3B:
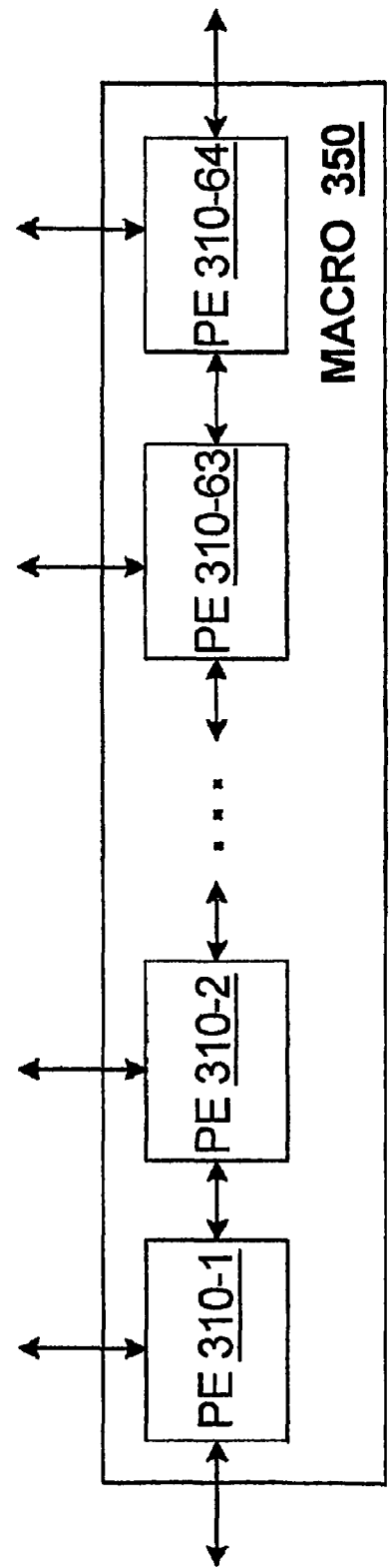
FIG. 3B Illustrates an embodiment of a Macro comprising one or more PEs of FIG. 3A.

An embodiment of a macro 350 is illustrated in FIG. 3B. The macro 350 may comprise one or more processing elements 310. In one embodiment, the macro 350 may comprise 64 PEs 310-1 to 310-64. Each PE may share the stored data with the other PEs to determine a new hard decision vector during each iteration. The macro 360 may be used to perform different operations such as input processing, row and column data processing, and row and column control processing.

Figure 4:
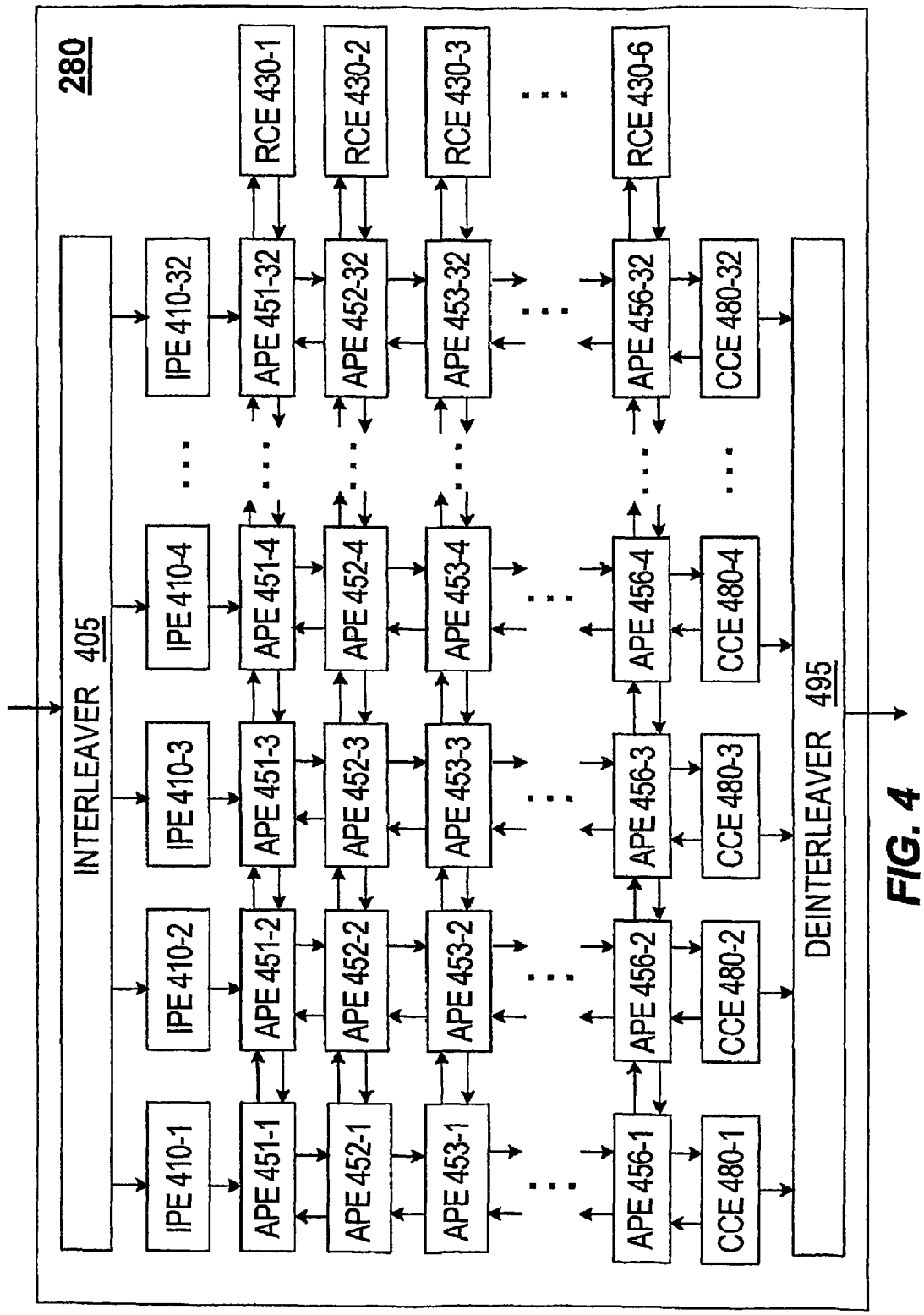
FIG. 4 illustrates an embodiment of a decoder comprising one or more Macros of FIG. 3B.

An embodiment of the decoder 180 is Illustrated in FIG. 4. In one embodiment, the decoder 180 may use LDPC codes of length 2048 bits, which may comprise information bits and redundant bits for forward error correction. The parity check matrix corresponding to the code length of 2048 bits may comprise 384 rows with 32 "ones" in each row and 6 "ones" in each column. The decoder 180 may thus comprise 32 numbers of the macro 350 in a row and 6 numbers of the macro 350 in a column.

Based on the position of the macro 350 in the decoder 180, the macro 350 may perform operations such as input data processing, row and column data processing, and row and column control processing. In one embodiment, the macros 350 that may be used to perform input data processing may be referred as input processing elements (IPE); the macros 350 that may used to perform row and column data processing may be referred as the associative processing elements (APE); the macros 350 that may be used to perform row control processing may be referred as row control elements (RCE); and the macros 350 that perform column control processing may be referred as column control elements (CCE).

In one embodiment, the decoder 180 may comprise an interleaver 405, IPEs 410-1 to 410-32, RCEs 430-1 to 430-6, APEs 451-1 to 456-32, CCEs 480-1 to 480-32, and a deinterleaver 495. The IPEs, APEs, RCEs, and CCEs may operate in word-parallel, bit-serial format. In one embodiment, structured arrangement of similar PEs may decrease the gate count and the conductor paths that may be used to couple each element. Thus, such an approach may reduce the real estate of the integrated circuit (IC) chip used to implement the decoder 180 and such an arrangement may increase the clock rate as well.

The interleaver 405 and deinterleaver 495 may be implemented for message routing and such other interfacing tasks. In one embodiment, the interleaver 405 may receive the initial reliabilities of the codewords and may route the initial reliability values (Ri) and initial hard decision values (Xi) to the IPEs. For example, the input reliability value corresponding to a first "one" in the first row may be sent to the first PE of the macro IPE 410-1. The deinterleaver 495 may collect hard decisions sent by each CCE before sending the information bits onward.

In one embodiment, the decoder 180 may comprise 32 IPEs, IPE 410-1 to 410-32 corresponding to each column. In one embodiment, the IPEs may generate hard decision vector and reliabilities vector based on the soft decision values. In one embodiment, the IPEs may buffer the input reliabilities of the received symbols, with each PE of the IPE 410 buffering one reliability value. Also, the decoder 180 may use the IPEs while updating the reliabilities in the columns. In one embodiment, the decoder 180 may cause the IPEs 410-1 to 410-32 to co-operatively operate with corresponding APEs in that column to generate the check sum Smn based on the threshold values and the comparison reliabilities Zmn.

The decoder 180 may comprise APEs 451-1 to 451-32 in row-1, APEs 452-1 to 452-32 in row-2, APEs 453-1 to 453-32 in row-3, APEs 454-1 to 454-32 in row-4, APEs 455-1 to 455-32 in row-5, and APEs 456-1 to 456-32 in row-6. In one embodiment, the APEs may store the updated reliability values of each "one" of the parity check matrix (H) and may participate in updating the reliabilities in each row and column. In one embodiment, the APEs in each row along with a corresponding RCE may determine Ymn(min) during each iteration. In one embodiment, the APEs in each row may receive control values such as comparand-1, comparand-2, mask, and sign and generate decision values such as a Some1, Some2, More1, and Sign values. The APEs in each column along with the CCE may determine the check sum Smn, Zmn, and one or more bits in the hard decision vector during each iteration.

Each row of the decoder 180 may comprise a control element such as the RCE. In one embodiment, the row-1 may comprise a RCE 430-1, which may generate control values such as comparand-1 and comparand-2 values, mask values, sign values, and clock signals to determine a first minimum and a second minimum value among the reliability values stored in each PE of the APEs 451-1 to 451-32. The RCE 430-1 may receive decision values such as Some1, Some2, and More1 that may indicate the presence of a first minimum and a second minimum value in the row-1. The RCE 430-1 may determine the first minimum and second minimum value based on a two-min algorithm and may store the first minimum and the second minimum values in a corresponding APE of the row-1.

Each column of the decoder 180 may comprise a control element such as the CCE. In one embodiment, the column-1 may comprise a CCE 480-1, which may generate update values such as Zmn and generate bits of the hard decision vector based on the values of Zmn. In one embodiment, the CCE 480-1 may operate along with the IPE 410-1 and APEs 451-1 to 456-1 to generate the comparison reliabilities Zmn based on the Smn value and the Ymn(min) values. In one embodiment, the CCE 480-1 may generate bits of the hard decision vector based on the values of Zmn and the threshold values.

Figure 5:
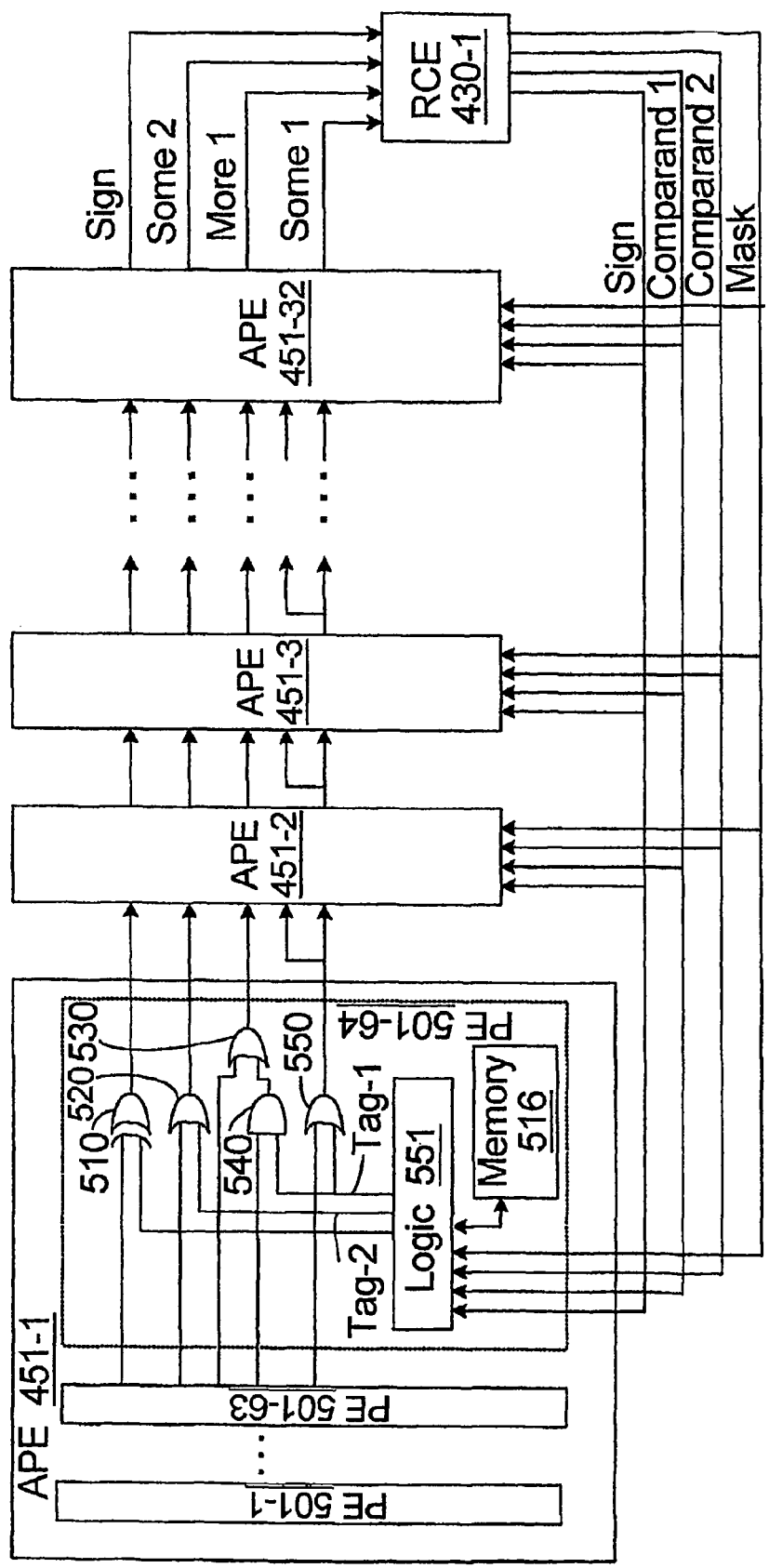
FIG. 5 depicts an embodiment of a row of the decoder of FIG. 4.

An embodiment of the PEs, in a row, collectively updating reliability values is Illustrated in FIG. 5. The APE 451-1 macro may comprise one or more PEs 501-1 to 501-64. The logic diagram of the PE 501-64 is depicted in detail in FIG. 5 and the other PEs of each APE 451-1 to 451-32 may be implemented in a similar manner. The PE 501-64 may comprise a logic 551, logic gates 510-550, and a memory 516.

The Logic 551 may generate update values such as a tag-1 and a tag-2 based on the control values such as a comparand-1, a comparand-2, a mask, and a sign. In one embodiment, the logic 551 may generate the tag-1 and the tag-2 values based on a rule:

tag-1=1, {if (comparand-1 AND mask)=(reliability $Y_i$ AND mask)} and 0, otherwise.

tag-2=1, {if (comparand-2 AND mask)=(reliability $Y_i$ AND mask)} and 0, otherwise.

In one embodiment, OR gates 550 of each PE may, together, generate a decision value, the Some1 based on the tag-1 value. In one embodiment, the Some1 equals one may indicate that at least one PE comprises a reliability value equaling the comparand-1 in masked bits. The Some1 value may be provided as an input to the RCE 430-1. In one embodiment, the logic gate 550 may use the tag-1 to generate the Some1 value based on the following rule:

Some1=1 (if at least one tag-1=1); or 0, otherwise.

In one embodiment, OR gates 520 of each PE in each APE may, together, generate the Some2 based on the tag-2 value. In one embodiment, the Some2 equals one may indicate that at least one PE may comprise a reliability value equaling the comparand-2 in masked bits. The Some2 value may be provided as an input to the RCE 430-1. In one embodiment, the Some2 may be determined based on the following rule:

Some2=1 (if at least one tag-2=1); or 0, otherwise.

In one embodiment, the Some1 and the Some2 may respectively indicate the presence of a first minimum value and a second minimum value among the reliability values stored in each APE 451-1 to 451-32.

In one embodiment, AND gates 540 and OR gates 530 of APE 451-1 to 451-32 may, collectively, generate the More1 value based on the tag-1 value. In one embodiment, the More1 equals 1 may indicate that more than one APE may comprise a reliability value equaling the first minimum value. In one embodiment, an AND gate 540 may perform AND operation of the tag-1 and a value received from a prior PE and the resulting value may be provided as an input to an OR gate 530. The OR gate 530 may perform OR operation of the output of AND gate 540 and a value received from a prior PE. The output generated by each APE may be used by a next APE to generate the More1 value based on the corresponding tag-1 values. The More1 value may be provided as an input to the RCE 430-1. In one embodiment, the More1 may be determined based on the following rule:

More1=1 (if at least two tag-1s in a row=1); or 0 otherwise.

In one embodiment, the XOR gate 510 may be used to generate a sign value and the sign value may be provided as an input to the RCE 430-1.

The RCE 430-1 may generate the control values such as the comparand-1, the comparand-2, the Mask, and the Sign before sending the control values to each APE 451-1 to 451-32. In one embodiment, the RCE 430-1 may generate comparand-1 and comparand-2 to respectively determine the first minimum value and the second minimum value of the reliability values stored in each APE 451-1 to 451-32. In one embodiment, during the initial iteration, the RCE 430-1 may generate the comparand-1 and comparand-2 to respectively equal 000 . . . 00 and 000 . . . 00 and the mask may equal 100 . . . 0 (MSB=1).

During the subsequent iterations, the RCE 430-1 may generate the control values such as the comparand-1, the comparand-2, the Mask, and the Sign values based on the decision values the Some1, the Some2, and the More1 received from the APEs 451-1 to 451-32 in the row-1. The RCE 430-1 may determine the $i^{th}$ bit of the comparand-1, the comparand-2, and the mask based on the following rules:

Comparand-1 [$i^{th}$ bit]=1, (if Some1=1); or 0, otherwise.

Comparand-2 [$i^{th}$ bit] 1, if {[(More1=0) AND (Comparand-1[MSB: i+1]=Comparand-2[MSB: i+1])] OR [(Some2=0) AND (Comparand-1[MSB: i+1]<>Comparand-2[MSB: i+1])]}; and 0, otherwise.

Mask [$i^{th}$ bit]=1.

The RCE 430-1 may perform the two-min search algorithm based on the decision values and the two-min search algorithm may be performed to determine the two minimum values of the reliability values in a corresponding row. The RCE 430-1 may update the reliability values in each PE of the row-1 based on the first minimum value and the second minimum value.

Figure 6:
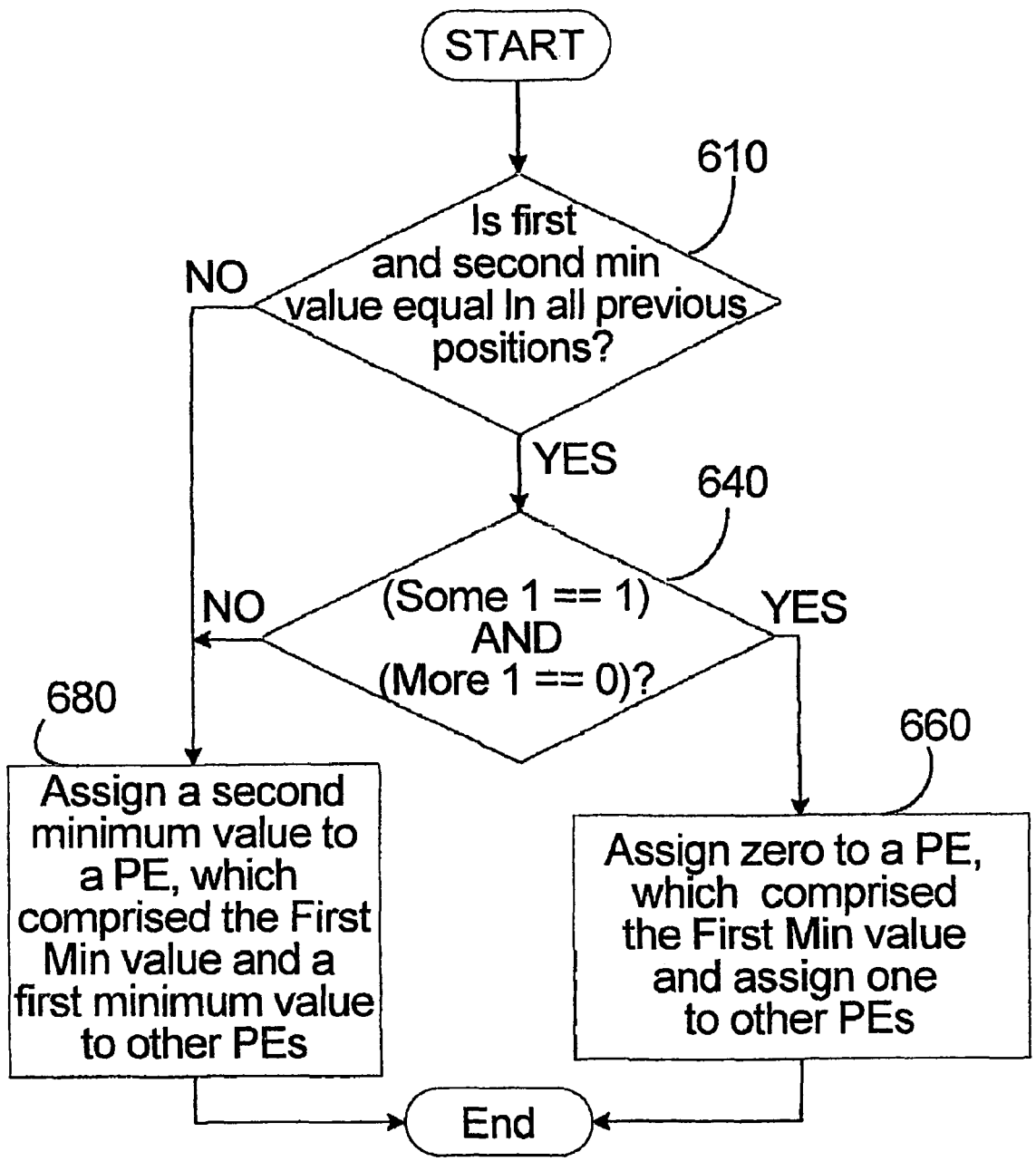
FIG. 6 depicts an operation of the row depicted in FIG. 5.

An embodiment of the RCE 430-1 performing the two-min search algorithm is illustrated in FIG. 6. In one embodiment, the two-min search algorithm may determine the first and the second minimum values among all values in the row-1. Such an approach may avoid determining the minimum value for each PE.

In block 610, the RCE 430-1 may determine if both the first and the second minimum values are equal in all the previous positions based on the decision values the Some1, the Some2, and the More1 and control passes to block 640 if both the minimum values are equal and to block 680 otherwise.

In block 640, the RCE 430-1 may check if (Some1 equals one) AND (More1 equals zero) and control passes to block 660 if the condition is true and to block 680 otherwise. In one embodiment, the RCE 430-1 may determine the two-minimums based on the rule that a first minimum value is stored into all the PEs in which the reliability value was not equal to the first minimum value and a second minimum value is stored into all other PEs. However, the first and second minimum reliability values may be equal. The Some1 equaling 1 and More1 equaling zero indicates that only one PE comprises the first minimum value and the Some1 and the More1 equaling one indicates that more than one PE may comprise the first minimum value.

In block 660, the RCE 430-1 may assign a zero to a PE comprising the first minimum value and a one to all other PEs comprising the second minimum value.

In block 680, the RCE 430-1 may assign the second minimum value as the reliability value to the PE which comprised the first minimum value before the iteration and the first minimum value may be assigned as the reliability value to all other PEs. The RCE 430-1 may assign the first minimum value to all other PEs comprising non-zero values of the row of the parity check matrix (H) except the PE, which comprised the first minimum value. The RCE 430-1 may assign the second minimum value for the PE, which was storing the first minimum value.

For example, if the PEs corresponding to non-zero values of the row-1 of the parity check matrix (H) may comprise reliability values such as 0.1, 0.2, 0.3, 0.4, 0.5; 0.6 . . . . After the two-min search process, the RCE 430-1 may determine that a first minimum value (=0.1) and a second minimum value (=0.2). The RCE 430-1 may change the reliability values of the corresponding PEs to 0.2, 0.1, 0.1, 0.1, 0.1, and 0.1. The RCE 430-1 of the row-1 may assign the second minimum value of 0.2 to a PE comprising the first minimum value before the present iteration and may assign the first minimum value to all other PEs, corresponding to non-zero value of the parity check matrix (H), in the row-1.

Figure 7:
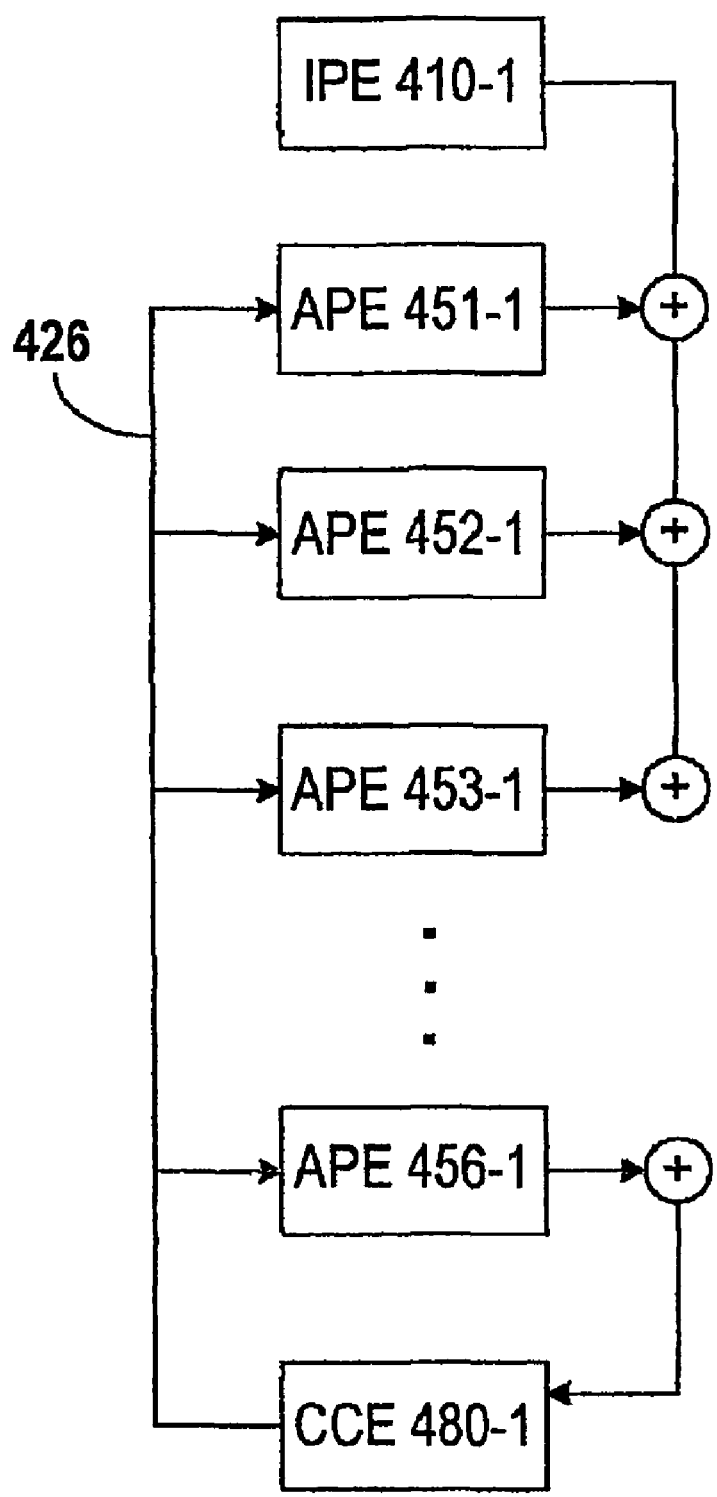
FIG. 7 depicts an embodiment of a column of the decoder of FIG. 4.

An embodiment of the PEs, collectively, updating the column reliability values is illustrated in FIG. 7. In one embodiment, the column-1 of the decoder 180 may comprise the IPE 410-1, APEs 451-1 to 456-1, and the CCE 480-1. In one embodiment, the CCE may be implemented as a serial, parallel, or mixed serial/parallel adder. In one embodiment, the CCE 480-1 may send broadcast message to the APEs in that column and the APEs may respond with, for example, the reliability values such as Xmn and Ymn(min).

In one embodiment, the CCE 480-1 may generate, during the first iteration, the check sum Smn based on the initial reliability values (Ri) and the initial hard decision vector (Xi). The value of Smn determined by the column processing and Ymn(min) determined by the row processing may be used to determine the updated reliability value Zn, which may be used as the comparison reliabilities Zmn. The CCE 480-1 may update parity check reliability values and generate bits of a new hard decision vector based on the Zmn and the threshold value. The CCE 480-1 may generate, during the subsequent iterations, the check sum Smn based on the updated reliability values (Xmn and Zmn) and the iteration process may continue until an error-free hard decision vector is determined or until a pre-determined number of iterations are performed.

Figure 8:
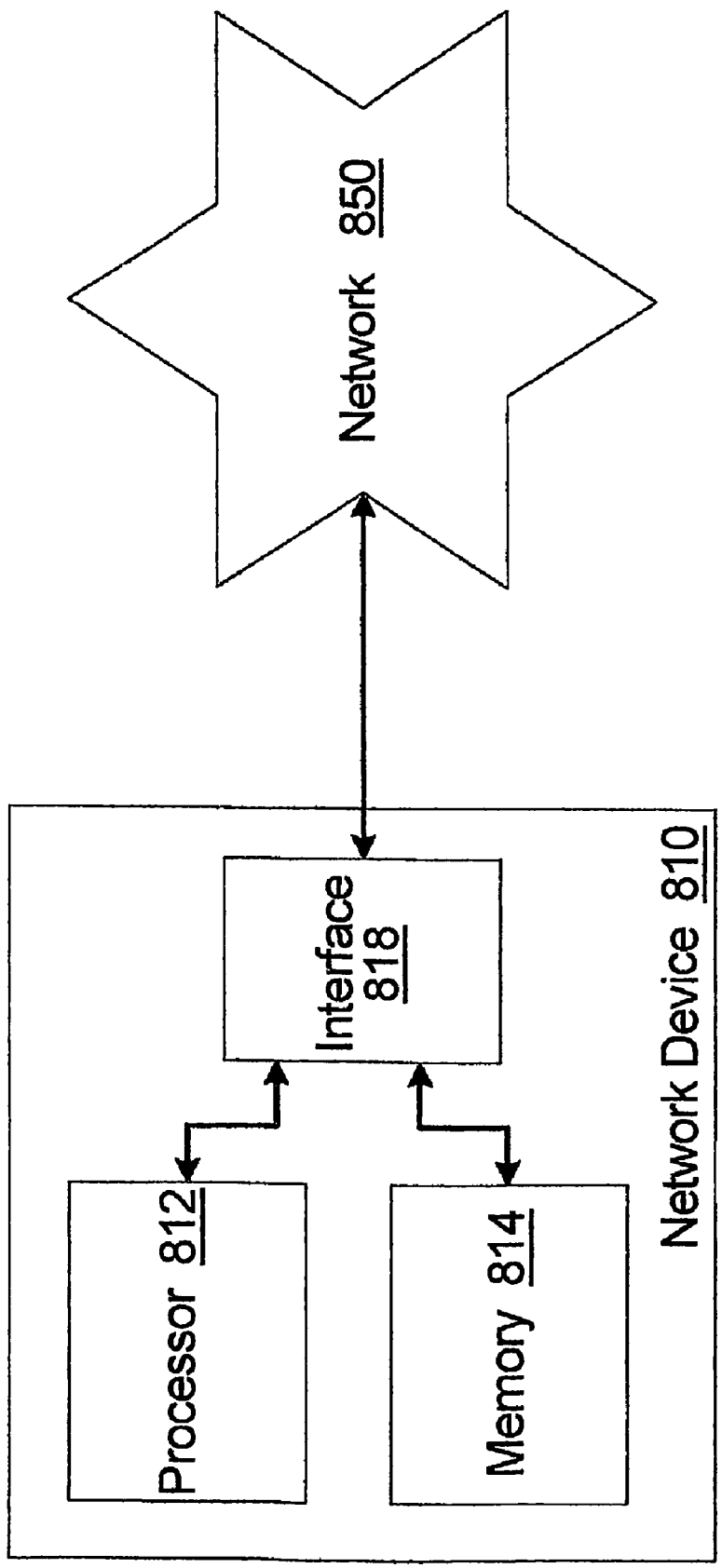
FIG. 8 illustrates an embodiment of the system comprising a transceiver 100 of FIG. 1.

An embodiment of a network system 800 is illustrated in FIG. 8. The network system 800 may comprise a network device 810 and a network 850. The network device 810 may correspond to a router, laptop computer, desktop computer, a hand held device, network interface card or any such devices that may be coupled to the network 850.

The network 850 may comprise one or more intermediate devices such as switches and routers, which may receive, process, and send the packets to an appropriate intermediate device. The network 850 may enable network devices such as the network device 810 to transmit and/or receive data. The intermediate devices of the network 850 may be configured to support TCP/IP, ATM and any such communication protocols. The network 850 may be coupled to the network devices such as the network device 810 via communication medium that may transfer packets corresponding to technologies such as 10G Ethernet.

The network device 810 may generate one or more packets and send the packets to other network devices coupled to the network 850. The network device 810 may receive packets from other network devices via the network 850. In one embodiment, the network device 810 may comprise a processor 812, memory 814, and a network interface 618. The processor 812 may cause the interface 818 to provide a voice, data, or video, to a user of the network device 810, in response to executing instructions and the memory 814 may store the instructions executed by the processor 812. The network interface 818 may comprise, for example, a network interface card embodying a transceiver such as transceiver 100.

In one embodiment, the transceiver 100 may communicate with the network 850 in accordance with the evolving 10GBase-T standard as defined by the IEEE 802.3an series of standards, however, other standards may be used as well. In some embodiments, the transceiver 100 may communicate with the network 850 using any type of medium such as but not limited to twisted pairs of copper wire, optic channels, wireless channels, power-line channels, acoustic/sonar channels, printed circuit board (PCB), backplanes, coaxial cable, or any other medium. For example, the communication medium 150 may be category 5, 6, 6a, or 7 network cabling and/or any other shielded or unshielded cabling.

The transceiver 100 may process the codewords or symbols representing data generated by applications such as an e-mail, voice, data, video or a file transfer application and received, for example, over a 10 GbE (10 giga-bit Ethernet) from the network 850. A receiver such as the transmitter 130 of transceiver 100 may receive the codewords or symbols and decode the codewords to generate bit streams using techniques described above. The receiver 130 may send the data streams to user interfaces, which may convert the data streams into a corresponding signal.

Certain features of the invention have been described with reference to example embodiments. However, the description is not intended to be construed in a limiting sense. Various modifications of the example embodiments, as well as other embodiments of the invention, which are apparent to persons skilled in the art to which the invention pertains are deemed to lie within the spirit and scope of the invention.

What is claimed is:

1. An apparatus comprising:
    a plurality of processing elements operating based on associative processing, the plurality of processing elements coupled to perform operations in word-parallel, bit-serial format, wherein the plurality of processing elements are further coupled to iteratively decode a received codeword using a bit reliability value such that for each iteration, the bit reliability value is updated based on a comparison using a threshold value based on a plurality of threshold values that are updated during the iterative decoding, each processing element in the plurality of processing elements further including:
        a memory unit for storing data, wherein the data stored within the memory unit is identified based on memory content rather than an address; and
        a processing logic unit for comparing the bit reliability value with the threshold value.

2. The apparatus of claim 1, wherein the plurality of processing elements includes input processing elements, row control elements, column control elements, and associative processing elements arranged in one or more rows and columns based on a presence of a first logic level present in each row and column of a low-density parity check matrix.

3. The apparatus of claim 2, wherein each column further comprises an input processing element that determines an initial bit reliability and an initial hard decision value for bit positions of a codeword based on soft decision values, wherein the codeword is generated based on the low-density parity check parity matrix and the soft decision values are generated based on a likelihood that a bit represents a first value.

4. The apparatus of claim 3, wherein the input processing element generates the initial bit reliability as equaling an absolute value of a value corresponding to the bit positions, and the initial hard decision value as equaling a second value if the soft decision value is positive and a third value otherwise.

5. The apparatus of claim 2, wherein a first row of the rows comprises a first set of associative processing elements and a first row control element, which, collectively, determine a first minimum value and a second minimum value of bit reliability values stored in the first set of associative processing elements during a first iteration.

6. The apparatus of claim 5, wherein the first row control element
    stores the first minimum value in the first set of associative processing element comprising a value other than the first minimum value, and
    stores the second minimum value in the first set of associative processing elements that stored the first minimum value before the first iteration.

7. The apparatus of claim 5, wherein the first row control element
    generates one or more control values comprising a first comparand and a mask to determine the presence of the first minimum value in the first set of associative processing element, a second comparand and a mask to determine the presence of the second minimum value in the first set of associative processing element, receives one or more decision values indicating presence of one or more of the first minimum value and the second minimum value, and determines the first minimum value and the second minimum value based on the one or more decision values.

8. The apparatus of claim 7, wherein the first set of associative processing elements receives the one or more control values, and generates the one or more decision values comprising a first value indicating a presence of the first minimum value in at least one of the first associative processing elements, a second value indicating a presence of the second minimum value in at least one of the first associative processing elements, and a third value indicating a presence of the first minimum value in at least two of the first associative processing elements.

9. The apparatus of claim 8, wherein the first set of associative processing elements comprise a first element, which further comprises a logic inside the processing logic unit to receive the one or more control values and generate update values, wherein the update values, wherein the update values represent a result of comparison of masked on bits of the first comparand and the bit reliability value stored in the first element, and a set of logic gates inside the processing logic unit to generate the one or more decision values based on the update values and send the decision values to a second element.

10. The apparatus of claim 2, wherein a first column of the columns comprise a first input processing element, a first column control element, and a second set of the associative processing elements, which, collectively, determine a first bit of an updated hard decision vector.

11. The apparatus of claim 10, wherein the first input processing element, the first column control element, and the second set of the associative processing elements, collectively, determine a first bit of an updated hard decision vector based on a first comparison reliability value and a first threshold value of the plurality of threshold values.

12. The apparatus of claim 11, wherein the first input processing element, the first column control element, and the second set of the associative processing elements, collectively, determine the first comparison reliability value based on a first check sum determined based on the hard decision values and a first minimum value representing a minimum value of the bit reliability stored in a first set of associative processing elements of a first row.

13. The apparatus of claim 1, wherein the plurality of processing elements determine the plurality of threshold values based on a first characteristic of a communication channel over which a low-density parity check codeword is received.

14. The apparatus of claim 1, wherein the plurality of processing elements continue to iteratively decode a low-density parity check codeword until a desired data stream is generated.

15. The apparatus of claim 1, wherein the plurality of processing elements continue to iteratively decode a low-density parity check codeword for log 2 n number of iterations, where n is a code length of the codeword.

16. A method comprising:

operating a plurality of processing elements based on associative processing, the plurality of processing elements performing operations in word-parallel, bit-serial format; and iteratively decoding, with the plurality of processing elements, a received codeword using a bit reliability value such that for each iteration, the bit reliability value is updated based on a comparison using a threshold value based on a plurality of threshold values that are updated during the iterative decoding, wherein each processing element in the plurality of processing elements includes:

a memory unit for storing data, wherein the data stored within the memory unit is identified based on memory content rather than an address; and a processing logic unit for comparing the bit reliability value with the threshold value.

17. The method of claim 16 further comprising:

determining a first minimum value and a second minimum value of bit reliability values stored in a first set of associative processing elements during a first iteration;

storing the first minimum value in the first set of associative processing element comprising a value other than the first minimum value; and storing the second minimum value in the first set of associative processing elements that stored the first minimum value before the first iteration.

18. The method of claim 17 further comprising:

generating one or more control values comprising a first comparand and a mask to determine the presence of the first minimum value in the first set of associative processing element;

generating a second comparand and a mask to determine the presence of the second minimum value in the first set of associative processing element, receiving one or more decision values indicating presence of one or more of the first minimum value and the second minimum value; and determining the first minimum value and the second minimum value based on the one or more decision values.

19. The method of claim 18 further comprising:

receiving the one or more control values;

generating the one or more decision values comprising a first value indicating a presence of the first minimum value in at least one of the first associative processing elements;

generating the one or more decision values comprising a second value indicating a presence of the second minimum value in at least one of the first associative processing elements; and generating the one or more decision values comprising a third value indicating a presence of the first minimum value in at least two of the first associative processing elements.

20. The method of claim 19 further comprising:

receiving the one or more control values;

generating a first update value, wherein the first update value represents a result of comparison of masked-in bits of the first comparand and a first bit reliability value; and generating a second update value, wherein the second update value represents a result of comparison of masked-in bits of the second comparand and a first bit reliability value.

21. A system comprising:

a transmitter;

a network interface to receive one or more codewords over a communication medium;

a receiver comprising a demodulator to generate soft decisions for the one or more codewords based on one or more characteristics of the communication medium; and a decoder comprising:

a plurality of processing elements operating based on associative processing, the plurality of processing elements coupled to perform operations in word-parallel, bit-serial format, wherein the plurality of processing elements are further coupled to iteratively decode a received codeword using a bit reliability value such that for each iteration, the bit reliability value is updated based on a comparison using a threshold value based on a plurality of threshold values that are updated during the iterative decoding, each processing element in the plurality of processing elements further including:

a memory unit for storing data, wherein the data stored within the memory unit is identified based on memory content rather than an address; and a processing logic unit for comparing the bit reliability value with the threshold value.

22. The system of claim 21 wherein the receiver receives the one or more codewords at a rate of at least 10 giga bits per second in accordance with 10 GBase-T standard.

23. The system of claim 21 further comprises
generating the one or more codewords by encoding a bit stream based on a low-density parity check codes and sending the one or more codewords over the communication medium, and the network interface to transmit the one or more codewords at a rate of at least 10 giga bits over the communication medium.

24. The system of claim 21 represents a network interface card.

25. The system of claim 21, wherein the system further includes at least one of a computer, a switch, a router, a handheld, a cell phone, or a server.

26. The method of claim 16, wherein the first set of associative processing elements:

determines the first minimum value and the second minimum value of bit reliability values by identifying the content of the first and second minimum values rather than identifying the address of the first and second minimum values contained in an on-board memory; and performs operations in word-parallel, bit-serial format.

* * * * *